United States Patent [19]

Larkin et al.

[11] 3,713,911

[45] Jan. 30, 1973

[54] METHOD OF DELINEATING SMALL AREAS AS IN MICROELECTRONIC COMPONENT FABRICATION

[75] Inventors: Melvyn W. Larkin, Southampton, Hampshire, England; Richard K. Matta, Irwin, Pa.

[73] Assignee: Westinghouse Electric Corporation, Pittsburgh, Pa.

[22] Filed: May 26, 1970

[21] Appl. No.: 40,626

Related U.S. Application Data

[63] Continuation-in-part of Ser. No. 588,882, Oct. 24, 1966, abandoned.

[52] U.S. Cl. .......................................148/187, 156/17
[51] Int. Cl. ..................................................H01l 7/44
[58] Field of Search ........148/1.5, 187; 117/43, 93.3, 117/93.31; 156/17

[56] References Cited

UNITED STATES PATENTS

| | | | |
|---|---|---|---|
| 3,272,670 | 9/1966 | Meyers | 156/13 |
| 3,363,760 | 1/1968 | Klein | 148/187 |
| 3,388,000 | 6/1968 | Waters et al. | 117/212 |
| 3,390,025 | 6/1968 | Strieter | 148/187 |

*Primary Examiner*—L. Dewayne Rutledge
*Assistant Examiner*—J. M. Davis
*Attorney*—F. Shapoe and C. L. Menzemer

[57] ABSTRACT

Overlapping geometric areas, such as intersecting stripes are used to define precise small areas while minimizing alignment problems. The method can be applied to making diffusion windows in semiconductor manufacture.

13 Claims, 16 Drawing Figures

METHOD OF DELINEATING SMALL AREAS AS IN MICROELECTRONIC COMPONENT FABRICATION

CROSS-REFERENCE TO RELATED APPLICATIONS

This application is a continuation-in-part of application Ser. No. 588,882 filed Oct. 24, 1966, now abandoned, the assignee of which is the same as that of the present application.

BACKGROUND OF THE INVENTION

1. Field of Invention

This invention is in the field of fabrication of articles requiring accurate delineation of small areas, and even smaller areas within a first group, as in the fabrication of microelectronic components such as semiconductor devices and integrated circuits and thin film devices.

2. Description of Prior Art

The present trend in microelectronic components is both to reduce the overall size of components and also to provide individual structures containing increasingly large numbers of elements. This trend results in the requirement for smaller individual device elements that are difficult to achieve with the existing technology.

In semiconductor integrated circuit fabrication, a sequence of successively formed masks of an insulating material, such as silicon dioxide, is utilized to define areas for impurity diffusion within a semiconductor body and to define the areas wherein metal is deposited to form contacts with the semiconductor body. An oxide mask is usually formed by coating an oxide layer with a layer of photosensitive material and exposing this material to light through a photographic mask. When the photosensitive material is subjected to a development procedure the exposed regions are not removed, in the case of a negative acting resist material, and therefore they define the material remaining in the oxide layer after it is exposed to an etchant. Positive acting photosensitive materials are also available which during development are removed where exposed.

In accordance with the prior art technique, a first oxide mask is formed, for example, for diffusion of bipolar transistor base regions. After that diffusion a second oxide mask must be formed with an opening within the base region for diffusion of the emitter region. Subsequently a third oxide mask for disposition of contacts to the various regions must be formed.

The resolution of photographic emulsions is adequate to define very small patterns although difficulties arise when the pattern is transferred from a photographic plate to the photoresist film due to diffraction and scattering of the light.

A further problem that arises is that to optically align the very fine patterns, that is, for example, to align the emitter diffusion mask pattern properly with the surface having the base diffusion in it, requires a high magnification microscope having an objective whose depth of focus is very small. It is, therefore, difficult to have the photographic mask and the slice in focus together while at the same time maintaining an adequate clearance between them to allow for movement of the photographic mask to the alignment position.

It has been shown that one micron wide lines can be defined by electron beam exposure of photoresist material, thus offering an improvement over optical exposure. Even with the high resolution capability of the electron beam, however, it remains a problem to make maximum use of this high resolution capability because present techniques lack sufficient resolution to permit reliable positioning of micron sized areas within an area only slightly larger than micron size. It is ordinarly necessary that a pattern be aligned with previous patterns within three coordinates of the two dimensional surface plane, the horizontal direction, X, the vertical direction, Y, and an angle of rotation, $\theta$. If the dimensions involved are small it is difficult to be sufficiently accurate in aligning all three coordinates.

It is, therefore, an object of the present invention to provide an improved method of delineating small areas without requiring difficult alignment procedures.

Another object is to provide an improved method of microelectronic component fabrication that can take advantage of the high resolution capability of an electron beam in exposing photoresist material.

Another object is to provide an improved method of making small electronic elements including, for example, planar transistors, that require reliable positioning of areas within other small areas.

Another object is to provide a method of delineating defined areas having dimensions as small as about 1 micron by taking advantage of the capability of an electron beam microscope for reliable alignment.

SUMMARY OF THE INVENTION

In accordance with the present invention there is provided a method of delineating a defined area or pattern of areas on a surface of much larger dimensions than said areas, as in microelectronic component fabrication, the steps comprising:

forming a first layer of a first material on said surface, having a first thickness in a major portion thereof and a second thickness, less than said first thickness, in at least one broad stripe-like portion extending across said surface;

forming a second layer of a second resist material on said first layer that has a gap of narrow stripe-like configuration extending entirely across said broad stripe-like portion and intersecting said broad stripe-like portion of said first layer;

removing said first material, using a means not removing said second material, to the extent of completely removing said second thickness and not completely removing said first thickness to expose a generally rectangular portion of said surface at the intersection of said broad stripe-like portion of said first layer and said gap of stripe-like configuration in said second layer, chemically treating the exposed rectangular portion of said surface, forming a third layer of the first material over the chemically treated exposed rectangular portion, the third layer being of lesser thickness than said second layer, applying a fourth layer of a resist material to the surface and providing a second narrow stripe-like gap transverse to the narrow stripe-like configuration of the second layer, and removing said third layer through the second narrow stripe-like gap, using a means of completely removing only the third layer at the intersection of the gap and the second narrow stripe-like gap portion whereby to expose a small area of said surface.

In the planar technology of fabrication of semiconductor devices the above-mentioned technique may be applied to the definition of windows in an oxide layer for base diffusion and to the successive placement of windows for emitter diffusion and contacts. It will be apparent however that the method in accordance with this invention offers an opportunity of defining areas within layers for other purposes such as in the formation of thin film electronic components wherein precisely defined evaporation masks are required, as well as many other potential applications.

BRIEF DESCRIPTION OF DRAWING

The invention will become more readily apparent from the following exemplary description in connection with the accompanying drawings, wherein:

FIGS. 3 through 16 are views of successive stages in the fabrication of small transistors in accordance with an example of the present invention wherein FIGS. 3, 7, 10 and 13 are plan views and the remaining figures are sectional views.

DESCRIPTION OF THE PREFERRED EMBODIMENT

Figure 1:
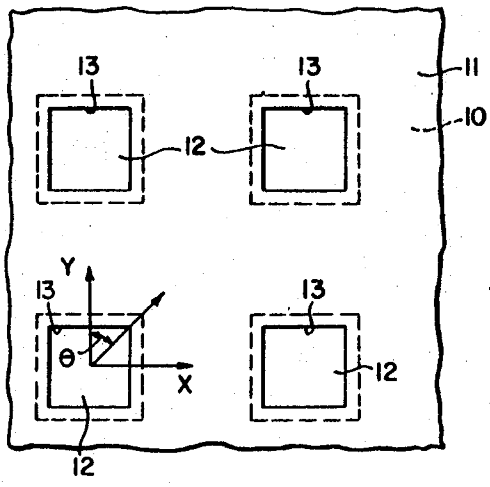
PRIOR ART FIG. 1.
FIG. 1 is a partial plan view of a complex semiconductor device that may be formed in accordance with the prior art.

The structure of FIG. 1 shows the oxidized surface 11 of a semiconductor body 10 wherein the distinct regions 12 occurring under the oxide layer are, for example, diffused base regions for bipolar transistors. For purposes of illustration the structure is chosen to be a simple one although in practice a multi-transistor unit may have some isolation means between the individual transistors such as a diffused isolation wall in accordance with known integrated circuit technology. The dashed lines identify the *p–n* junctions formed by the diffusion of regions 12. The solid lines represent depressions 13 in the oxide layer resulting from reformation of the original oxide layer during the diffusion step.

Figure 2:
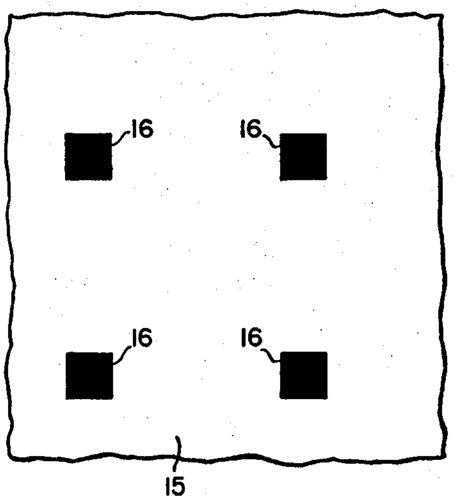
FIG. 2 is a partial plan view of an optical mask that in accordance with the prior art must be aligned with the pattern illustrated in FIG. 1.

FIG. 2 is an optical mask 15 to be used in the formation of the windows through the oxide layer 13 of FIG. 1 for diffusion of emitter regions within each of the transistor base regions. The mask assumes the use of a negative acting photoresist material which is the usual practice. The dark squares 16 of the mask will shield portions of the photoresist layer (not shown) that may be applied to the structure of FIG. 1 so that they remain unexposed and are removable upon subsequent development. In positioning such a mask over a photoresist coated surface it it necessary to align the mask with the previously existing pattern. In this case each of the emitter squares 16 of the photomask must be positioned over one of the base regions. Assuming the patterns are sufficiently large to be visible to an operator viewing them through a microscope, the alignment procedure is carried out to match three coordinates in the two dimensional plane of the surface.

These coordinates are illustrated in FIG. 1 for emitter a case in which the operator chooses to align one of the emtter dots within the lower left-hand base region. It is required that precise positioning in the horizontal, X, direction, be achieved so that the emitter window will not occur too near the edge of the base region 12. Similarly, careful alignment in the vertical direction, y, is necessary. Furthermore, so that the other emitter dots will be directly positioned within their respective base regions, it is necessary that the mask not be rotated through any appreciable angle, $\theta$.

With smaller and smaller dimensions the alignment procedure as described becomes evermore tedious, unreliable and thus presents a distinct obstacle to the ability to fabricate small structures. While the patterns of FIGS. 1 and 2 are of squares, any configurational pattern presents similar problems wherever the optical mask pattern, such as the emitter dots of FIG. 2, must be positioned inside a closed configuration of another pattern such as the base regions of FIG. 1.

The present invention avoids the precise alignment problems of the prior art and thus permits the making of smaller structures. The technique of this invention is generally applicable to the successive disposition of any pattern on a surface particularly to form an opening through a layer such as for microelectronic component fabrication. The succeeding description discloses now this technique can be and has been applied to the fabrication of small planar transistors.

Figure 3:
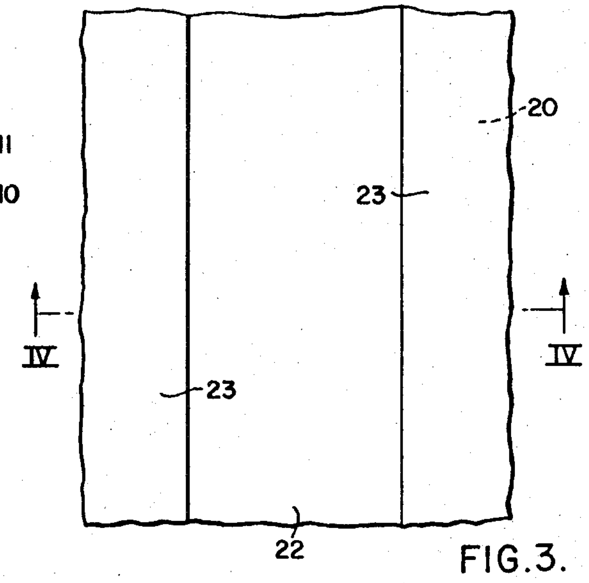
FIG. 3. PRIOR ART
Figure 4:
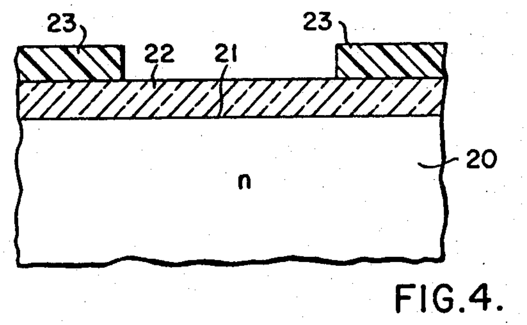

FIGS. 3 and 4 are respectively plan and sectional views, the latter being along the line IV—IV of FIG. 3, of a structure including a semiconductor substrate 20 such as a single crystal body of n-type silicon suitable for device formation although other semiconductive materials and reverse conductivity types may, of course, be employed. The body 20 of semiconductive material may be a uniform wafer or the portion illustrated may be of an epitaxial layer on a substrate of different type or resistivity. The material of the semiconductor body may be selected from a wide range of resistivities in accordance with existing technology and, merely as an example, may be doped with phosphorus to provide a resistivity of about 10 ohm-centimeters.

A major planar surface 21 of the body is covered with a layer 22 of insulating material that has the properties of acting as a mask against at least some doping impurities such as boron and phosphorus. In the case of silicon the insulating layer may, as is usual, be of silicon dioxide or it may be of other refractory insulating materials such as oxides and nitrides whether compounds of the semiconductor material or otherwise. Throughout the ensuring description of this illustrative application of the invention the use of silicon dioxide on silicon will be assumed.

It is known that for an adequate diffusion mask of silicon dioxide a thermally oxidized layer having a minimum thickness of about 1,500 angstroms is sufficient. For reasons that will become more readily apparent hereinafter, the initial oxide layer illustrated should be considerably in excess of this minimum thickness. The extent of this excess thickness depends on the number of subsequent operations to be performed on the layer. In transistor fabrication where it is desired to first diffuse a base region and then an emitter region within the base region and then for contacts to be formed on each of the emitter and base regions, the initial oxide layer thickness should be about 2 to 6 times the minimum diffusion mask thickness referred to above. For purposes of more specific example the initial oxide layer may have a uniform thickness of about 8,000 angstroms.

FIGS. 3 and 4 also illustrate on the surface of the oxide layer 22 a mask 23 of material that is resistant to etchants that attack the oxide layer. This first mask 23 may be of any of a number of commercially available or otherwise known photoresist materials and may be applied in a uniform coating, exposed through an optical mask and developed to provide the desired pattern.

Improved resolution, permitting smaller components, is provided through the use of electron beam exposure of photoresist using, for example, a scanning electron microscope rather than optical exposure. Suitable apparatus and techniques for performing electron beam operations in the practice of this invention, are described, for example, in the following articles which should be referred to for further information:

Everhart et al., article, *J. Electrochem.* Soc.,, 111, pp. 929–935 (1964);

Everhart et. al., article, *Proc. IEEE*, *52*, p. 1642 (1064);

Thornhill et al., article, *Microelectronics and Reliability*, 4, pp. 97–100 (1965)

It has been found that one micron wide exposures of photoresist material can be achieved through use of the electron beam microscope.

The photoresist defines a stripe extending across the oxide surface. This stripe for reasons that will be more apparent hereinafter is considerably wider than the resolution limit of the photoresist material. For example, where optical techniques are used this stripe may be about 250 microns wide. Where electron beam techniques are used a 10 micron wide stripe is exposed and developed.

Although the photoresist material may be selected from a wide variety it may be desirable in developing a stripe pattern (particularly by use of electron beam techniques) to utilize a positive acting photoresist, that is, one which is removed upon development where it has been exposed. Devices have been made using the electron beam exposure techniques with such a photoresist, commercially available as AZ 1350 positive-working photoresist, manufactured by Azoplate Corporation and distributed by Shipley Co. Inc., Newton Mass. Such a photoresist may be a 600 angstroms thick layer exposed to about 30 KV electrons with a beam charge density of about 5 to 10 $\times 10^{-5}$ coulombs per square centimeter.

The structure is then subjected to an etchant removing the exposed oxide. The etchant and the time of its application may be determined in accordance with known techniques in order to provide the desired window through the oxide layer with minimal undercutting, that is, etching away of oxide at the edges of the window. For example, in the case of the thermally grown oxide layer of 8,000 angstroms thickness protected by the above referred to positive acting photoresist a suitable etchant is a solution of 6 parts ammonium fluoride ($NH_4F$) to 1 part hydrofluoric acid (Conc.HF) applied for about 8 minutes at 25°C. Suitable conditions for other etchants on silicon dioxide or other insulating layers may be readily established.

Figure 5:
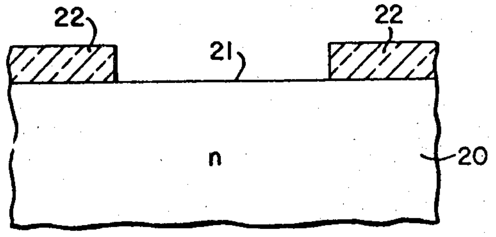

The resulting etched structure is illustrated in FIG. 5, the photoresist mask having been removed by some known technique suited for the particularly photoresist material.

Figure 6:
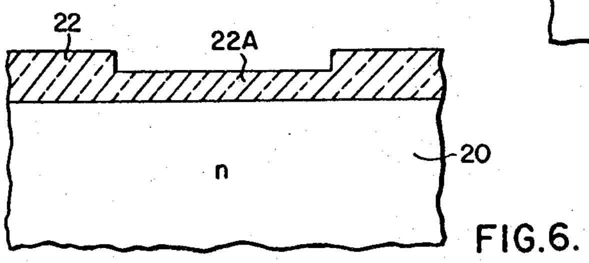

Reformation of the insulating layer 22 is then performed (FIG. 6) in order to provide on the exposed surface 21 a portion 22A having a thickness less than that of the original portion 22. For example, the structure may be subjected to further thermal oxidation to provide a layer on the exposed surface of silicon dioxide in a thickness of about 5,000 angstroms. During this operation some additional oxide is also formed on the existing 8,000 angstroms thick layer although oxide formation by this technique is not linear with increasing thickness. The original oxide layer 22 is now in a thickness of about 10,000 angstroms. In general, throughout the practice of this invention using silicon dioxide layers it is desirable that each step or difference in thickness between adjacent portions of oxide layers be at least approximately 1,500 angstroms in order to obtain the beneficial effect o f the invention.

Figure 7:
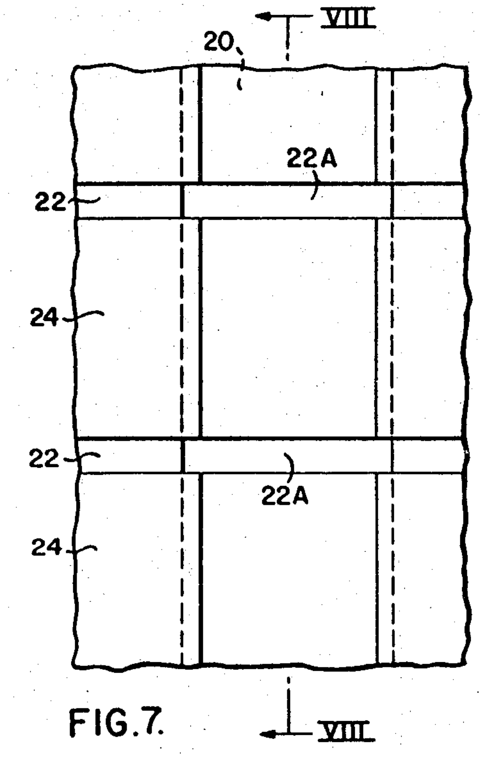
Figure 8:
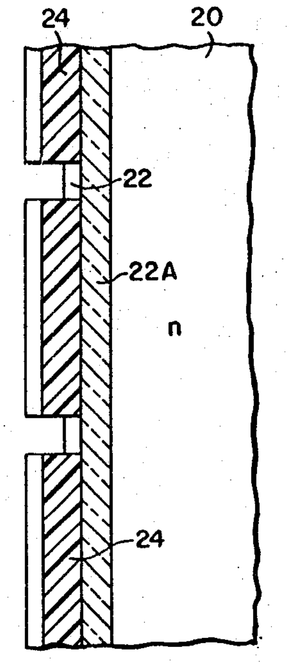

FIGS. 7 and 8 (FIG. 8 being a sectional view along the line VIII—VIII of FIG. 7) illustrate the structure after a second photoresist mask 24 has been formed on the oxide surface. This mask may be of the same type as the first mask 24 and is exposed and developed in a pattern that overlaps that of the first mask, as illustrated, and provides gaps intersecting the strip portion 22A of lesser oxide thickness formed as a result of the first mask 23. There is no problem aligning this mask, despite the fact that it may be at the limit of exposure resolution, with the previously formed pattern since it is merely necessary that the stripes intersect at approximately, but not necessarily exactly, right angles. These transverse stripes extend across the surface including both portions 22 and 22A of different thickness of the oxide layer. An etchant is applied, such as described before, for a controlled time so as to remove entirely only that exposed portion 22A having the lesser thickness thus exposing only a rectangular region of body 20 defined by the intersection of the vertical and horizontal stripes. Removal of 5,000 angstroms of silicon dioxide by the above etchant may be performed by applying the etchant at 25°C for about 5 minutes.

Figure 9:
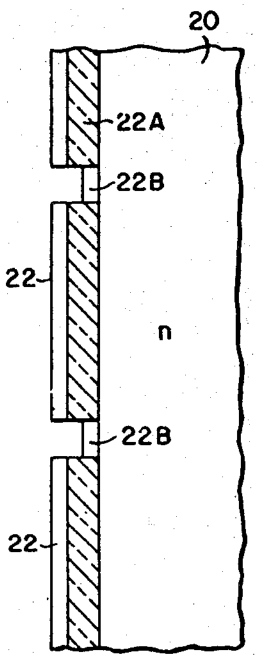

The result, illustrated in FIG. 9, is an oxide diffusion mask suitable, as an example, for the diffusion of base regions of a plurality, here two, of bipolar transistors. Exposed portions 22B of original oxide 22 are reduced in thickness to about 5,000 A.

The diffusion may proceed by straightforward prior art techniques usually involving the deposition of an impurity containing material (e.g., a boron compound to form a p-type region) on the surface from a vapor and then in an atmosphere free of impurities and usually containing an oxidizing agent the impurities are redistributed to provide the desired diffusion profile. As is known the impurities diffuse in the plane of the surface as well as perpendicular thereto so that the junction is formed under the oxide mask. Reformation of the oxide over the window area is desirable for use in subsequent mask formation. A suitable thickness of silicon dioxide of about 2,000 angstroms is formed during the redistribution of impurities.

Figure 10:
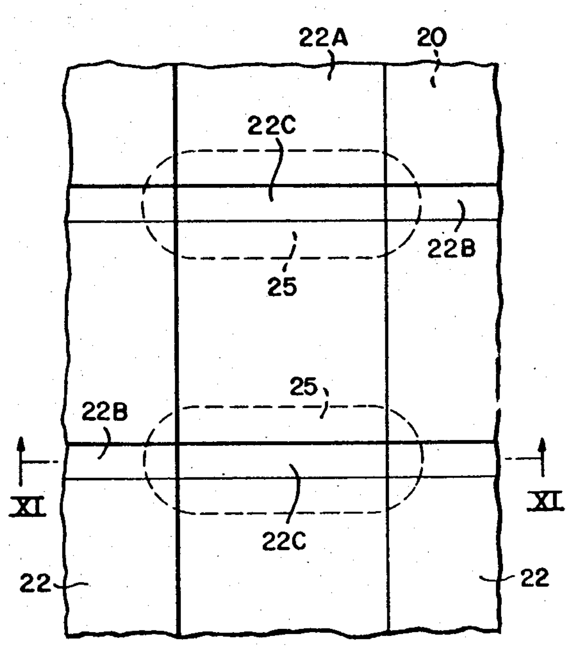
Figure 11:
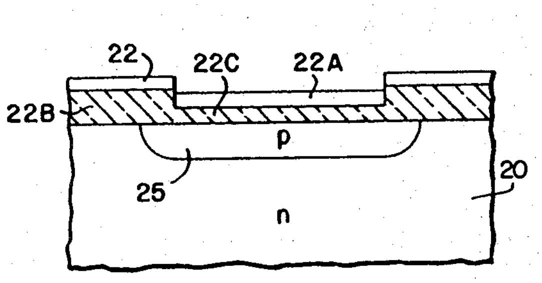

FIGS. 10 and 11, of which FIG. 11 is a sectional view along the line XI—XI of FIG. 10, illustrate the diffused regions 25 and the reformed oxide layer portion 22C. As before, some additional oxide is formed on remaining portions of the oxide layer but the relative difference in thicknesses still exists.

Figure 12:
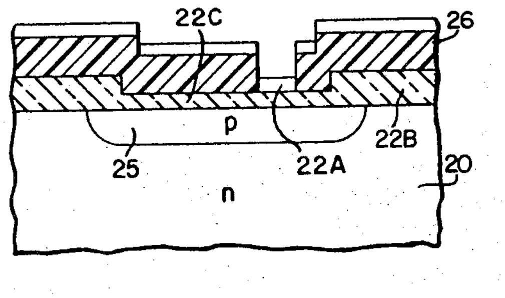
Figure 13:
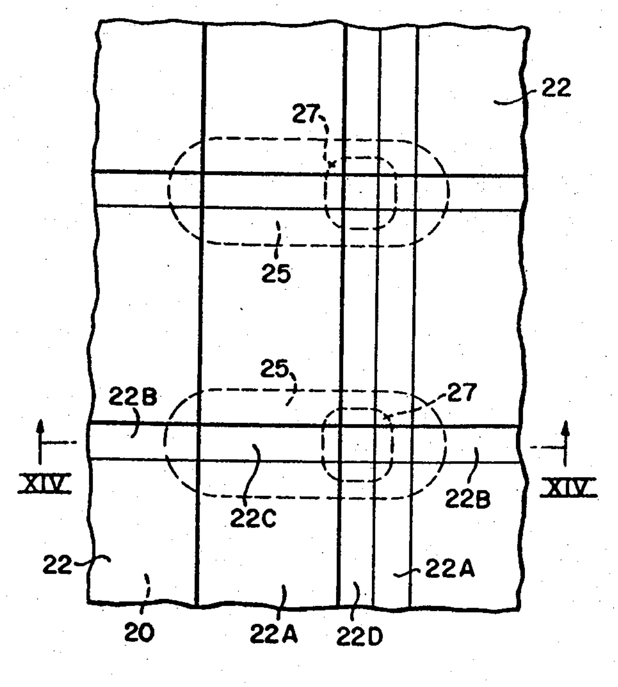

FIG. 12 shows the structure after a third photoresist mask 26 has been formed on the surface. This mask has a stripe like gap running within the first vertical stripe (as shown in FIG. 13. An oxide etch is performed that removes only the minimum thickness of exposed oxide 22C formed during the base diffusion, thus leaving on the other portions of the surface, sufficient oxide to act as a diffusion mask for the emitter diffusion. Etched portions 22D of oxide portion 22A result as shown in FIG. 13. The formation of the third photoresist mask 26 is much simpler than in accordance with the prior art particularly since the stripe need not be vertically aligned.

Figure 14:
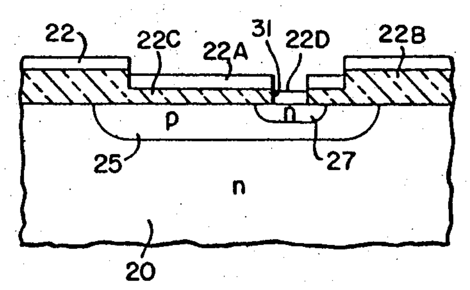

The emitter diffusion is performed by straightforward techniques through opening 31 in the oxide 22C resulting in the structures of FIGS. 13 and 14 of which FIG. 14 is a sectional view taken along the line XIV-XIV of FIG. 13. As illustrated, the boundaries of the diffusion region 27 are well within the boundaries of region 25. The emitter diffusion may be performed without reformation of the oxide layer but if some residual dopant material occurs on the surface of the emitter region 27, such as a phosphorus glass, that would interfere with contact formation the structure may be subjected to a light etch without masking that will remove that coating.

The emitter diffusion may be performed simultaneously with diffusion into the original substrate 20 of additional n-type doping impurities to form a lower resistivity region (not shown) for formation of a collect contact on the top surface.

In a similar manner a base contact opening 30 may be produced in the oxide.

Figure 15:
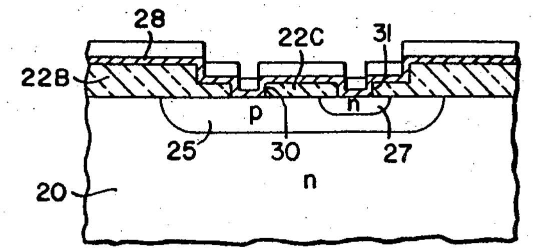
Figure 16:
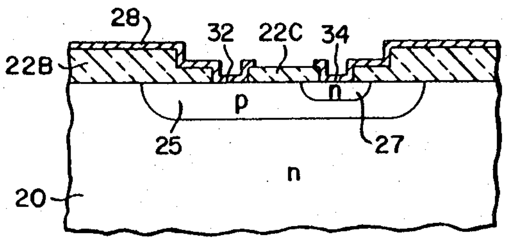

The formation of contacts to the emitter and base regions may be achieved by depositing a layer 28 metallic material such as aluminum over the entire surface including openings 31 and 30 in oxide layer 22C as shown in FIG. 15. The opening 30 being provided where an additional stripe of exposed base material 25 has been formed parallel to the stripe for emitter diffusion by a fourth photoresist mask, not illustrated in the drawings. The metallic material 28 may then be selectively removed to provide individual contacts to the elements 34 to the emitter region 27 and 32 to the base region 25 and interconnections running over the oxide layer surface, FIG. 16. The same concept of utilizing intersecting stripes for the definition of areas may be employed in selecting these areas to be removed from the conductive layer.

The application of this invention to the formation of contacts and interconnections on the surface of a semiconductor body may proceed, for example, as follows. After formation of the structure of FIG. 15, the fourth photoresist mask is applied. In contrast to the previous masks, the fourth mask is preferably of a negative-acting photoresist (e.g., KMER sold by Eastman Kodak Company) because the operations to be performed, again contemplating use of an electron beam, are the reverse of those previously described. Here, rather than the formation of small openings, it is desired to leave remaining small areas of the metal layer. The photoresist is therefore exposed where metal is to be retained, the mask developed and the metal etched.

It will be understood that the technique described in connection with FIGS. 3 through 16 may be directly applied to the fabrication of other planar semiconductor structures either simultaneously with bipolar transistor fabrication or otherwise. Furthermore the technique may be applied to provide precisely located openings within a layer of material on a surface generally utilizing the stripe technique for defining the area and controlled etching to remove portions of the layer only in the defined area.

In actual devices made wherein the base window diffusion was through a window ten microns long by one micron wide the subsequent stripes for the emitter diffusion and for the base contact area were one micron wide utilizing electron beam exposure of the photoresist material. Utilizing optical exposures, stripe widths of 250 microns and 25 microns respectively are convenient.

While the present invention may be applied with either optical or electron beam exposure of photoresist, it is apparent that best resolution is obtainable with electron beam exposure. Where the electron beam is used for this purpose a certain amount of care has to be taken in the manner of exposing the photoresist and developing it to take advantage of the high resolution capability. In order to achieve consistency in producing 1 micron wide exposures with the equipment described in the aforementioned articles it is necessary to have good control over several factors. First, it is necessary that the surface be adequately prepared prior to coating it with photoresist. Thorough cleaning by means of solvents and baking at 165°C for about 30 minutes is found adequate for this purpose. It is also found that inconsistent results would be obtained using resist that has aged or been exposed to air for any appreciable length of time. Thus it is desirable that fresh, uncontaminated photoresist be used. It is also found that an optimum charge density exists at which exposure should occur for a particular photoresist. As indicated above the optimum found for the positive acting photoresist, AZ 1350, is about $8 \times 10^{-5}$ coulombs per square centimeter and optimum exposure may be determined by straightforward experimentation for other photoresist materials.

For such fine resolution photoresist masks, care must be also taken in the development of the photoresist to insure that it is fully developed. It is found that examination with a good optical microscope permits determination of when the windows in the photomasks are open.

The lateral spacing of the stripes for emitter diffusion and for base contact windows is difficult to align, as well as expose, optically at 1 micron levels. Photoresist masks for formation of interconnections to such structures are also difficult to form and align optically. To take advantage of the high resolution capability of an electron beam is exposing photoresist it is also desirable to use the electron beam for alignment. This has led to new alignment procedures representing additional aspects of the present invention that are not limited to application with the intersecting stripe technique. These alignment procedures may be performed at beam energies and intensities that permit subsequent exposure and development of a photoresist layer on the surface.

It is known that $p$–$n$ junctions may be observed using an electron beam microscope. One technique is to read the photovoltage developed by a uniform beam on a sample which varies in accordance with distance from a $p$–$n$ junction. For alignment purposes, the photovoltage technique must be carefully practiced or errors will result due to the fact that the photovoltage response is delayed a finite time relative to the electron bombardment that causes the photovoltage. Slow scan rates minimize this source of error. Scanning a sample in two opposite directions at uniform rates and averaging the photovoltage response at each point provides a reliable pattern that may be used for alignment.

Another known technique for viewing $p$–$n$ junctions by an electron beam microscope is to apply a reverse bias across the junction and to view the voltage contrast effect on the secondary electron image. For alignment purposes this requires some means to contact $p$ and $n$ regions by optical viewing. This was accomplished in making the multiple planar transistor described above by initially forming a diffused p-layer everywhere on the n-type slice of starting material except in n type areas where devices are to be fabricated. Contact to the p-layer could be readily made on the top surface and contact to all the $n$ regions on the bottom surface of the slice. The junctions themselves are not sufficiently uniform to perform alignment at micron levels.

With the electron beam to the sample blanked off, a single vertical line (although some other indexing configuration may be used) was scanned on the monitor screen of the electron microscope which has a long persistence phosphor, i.e., long compared to the time required to move the sample into alignment. The surface was again viewed imposing the voltage contrast image on the single vertical line. Alignment is then accomplished by moving the sample to the required position with respect to this line. Then precise exposure of photoresist on the slice may be accomplished.

We claim as our invention:

1. In a method of delineating a defined area or pattern of areas on a surface of much larger dimensions than said areas, as in microelectronic component fabrication, the steps comprising:

forming a first layer of a first material on said surface, having a first thickness in a major portion thereof and a second thickness, less than said first thickness, in at least one broad stripe-like portion extending across said surface;

forming a second layer of a resist material on said first layer that has a gap of narrow strip-like configuration extending entirely across said broad stripe-like portion and intersecting, at approximately a right angle, said broad stripe-like portion of said first layer;

removing said first material, using a means not removing said second material, to the extent of completely removing said second thickness and not completely removing said first thickness to expose a generally rectangular portion of said surface at the intersection of said broad strip-like portion of said first layer and said gap of stripe-like configuration in said second layer, chemically treating the exposed rectangular portion of said surface, and removing the second layer from the surface, forming a third layer of the first material over the chemically treated exposed rectangular portion, the third layer being of lesser thickness than said first material adjacent to said exposed rectangular portion, applying a fourth layer of a resist material to the surface and providing a second narrow stripe-like gap transverse to the narrow stripe-like configuration of the second layer, and removing said third layer through the second narrow stripe-like gap, using a means of completely removing only the third layer at the intersection of the gap and the second narrow stripe-like gap portion whereby to expose a small area of said surface.

2. The method of claim 1 wherein:

said removing is performed using a chemical etchant to which said second material is resistant.

3. The method of claim 1 wherein:

said surface is that of a body of semiconductor material; said first material is of an insulating material for use as a diffusion mask; said second material is a photoresist material.

4. The method of claim 1 further comprising:

depositing a material on said exposed surface utilizing said first layer as a mask.

5. The method of claim 3 wherein:

said exposed surface of said body of semiconductor material comprises material of a first conductivity type and further comprising diffusing a quantity of doping impurity capable of imparting a second conductivity type within said exposed surface to form a first diffused region;

reforming said layer of insulating material so that minimal thickness occurs over said first diffused region;

replacing said second layer by a third layer of said photoresist material having a gap of stripe-like configuration extending across said first diffused region;

removing said insulating layer, using a means not removing said photoresist material, to the extent of completely removing said minimal thickness portion only to expose said surface in an area within said first diffused region; diffusing a quantity of doping impurity capable of imparting said first conductivity type within said exposed surface of said first diffused region to form a second diffused region.

6. In a method of semiconductor device fabrication, the steps comprising:

forming a first layer comprising a broad stripe of a first thickness of diffusion masking material on the surface of a semiconductive region of a first conductivity type, the rest of the layer being materially thicker than at said broad stripe;

forming a first photoresist mask on said first layer of diffusion masking material, said mask having a narrow stripe-like opening completely across and transverse to said broad stripe; chemically etching said first layer of diffusion masking material exposed by said first photoresist mask, whereby, said first thickness is completely removed and the remainder portion has its thickness reduced;

stripping said first photoresist mask from said first layer; reforming said first layer where etched without impurity diffusion therethrough to a second thickness less than said first thickness;

forming a second photoresist mask on said first layer having an opening of a second narrow stripe-like configuration transverse to and overlapping only a portion of said first configuration; chemically etching said first layer exposed by said second photoresist mask to remove entirely only the portion having said second thickness and expose a small first portion of said surface corresponding to said intersected area of both stripes; stripping said second photoresist mask from first layer; diffusing a quantity of doping impurity capable of imparting conductivity of a second type into said first portion of said surface to form a first diffused region.

7. The method of claim 6 wherein:

said first and second configurations are intersecting stripes.

8. The method of claim 6 wherein:

said first and second photoresist masks are formed by electron beam exposure of photoresist material.

9. The method of claim 6 wherein:

with or following the diffusing step to form said first diffused region said first layer is again reformed where removed to provide a portion of minimal thickness over said first diffused region;

forming a third photoresist mask on said first layer having an opening of a third configuration overlapping a first part of said portion of minimal thickness;

chemically etching said first layer where exposed by said third photoresist mask to remove entirely only the exposed first part of said portion of minimal thickness and to expose a second portion of said surface;

stripping said third photoresist mask from said first layer;

diffusing a quantity of doping impurity capable of imparting conductivity of said first type into said second portion of said surface to form a second diffused region within said first diffused region.

10. The subject matter of claim 9 wherein:

said first and second configurations are intersecting stripes and said third configuration is a stripe contained within said running approximately parallel to said first configuration.

11. The subject matter of claim 9 wherein:

subsequent to the diffusing of said second region a fourth photoresist mask is formed on said first layer having an opening of a fourth configuration overlapping a second part of said portion of minimal thickness;

chemically etching said first layer where exposed by said fourth photoresist mask to remove entirely only the exposed second part of said portion of minimal thickness and to expose a third portion of said surface;

stripping said fourth photoresist mask from said first layer;

depositing a layer of metal on said first layer to contact said second diffused region and said second part of said first diffused region.

12. In the method of providing defined small areas on predetermined located portions of the surface of a body with a minimum of alignment error, the steps comprising a. providing on the surface of the body a first layer of a relatively great thickness of a masking material,
b. disposing a resist coating over said first layer, treating the resist coating to remove a relatively wide stripe of the resist so as to expose a wide stripe of the first layer of masking material,
c. removing the exposed wide stripe of the masking material, to expose a wide stripe of the surface of the body,
d. providing on the exposed wide stripe of the surface of the body a second layer of masking material of a materially lesser thickness as compared to thicknesses of the first layer of masking material,
e. disposing a second resist coating over the layers of masking material,
f. treating the second resist coating so as to remove a plurality of relatively narrow stripes in a direction transverse to the wide stripe and completely crossing the wide stripe, thereby exposing a plurality of first transverse narrow stripes of both layers of the masking materials,
g. applying an etchant under conditions to remove only the second layer at said exposed narrow stripes, a substantial thickness of the exposed first layer beyond the broad stripe area remaining unaffected by the etchant, thereby exposing narrow stripes of the surface of the body extending from one side to the other of the broad stripe portion,
h. chemically treating the exposed transverse narrow stripes of the body, to produce a desired change thereof at such exposed transverse narrow stripes,
i. applying a third masking layer of a thickness materially less than the thickness of the second layer,
j. applying a third resist coating to the surface,
k. treating the third resist coating to remove at least one second narrow stripe substantially within the broad stripe and substantially transverse to the first narrow stripe, thereby exposing a desired defined area of the masking layer at the intersection of the first and second narrow stripes, and
l. applying an etchant under conditions to remove only the third masking layer at said intersection, thereby exposing the surface of said body only at said intersection end of an area corresponding to the dimensions of the widths of the narrow stripes, and each area being located within the area of the broad stripe.

13. The method of claim 12 wherein the body is a semiconductor wafer, and the first, second and third layers are an insulating oxide.

* * * * *